US012694909B2

(12) United States Patent
Han

(10) Patent No.: US 12,694,909 B2
(45) Date of Patent: Jul. 28, 2026

(54) SEMICONDUCTOR DEVICE AND STACK TYPE SEMICONDUCTOR MEMORY DEVICE INCLUDING THE SAME

(71) Applicant: SK hynix Inc., Icheon-si (KR)

(72) Inventor: Min Sik Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 221 days.

(21) Appl. No.: 18/466,569

(22) Filed: Sep. 13, 2023

(65) Prior Publication Data

US 2024/0379134 A1 Nov. 14, 2024

(30) Foreign Application Priority Data

May 9, 2023 (KR) ........................ 10-2023-0059763

(51) Int. Cl.
*G11C 5/06* (2006.01)
*H10B 80/00* (2023.01)
*H10W 90/00* (2026.01)
*H10W 90/20* (2026.01)

(52) U.S. Cl.
CPC ............. *G11C 5/066* (2013.01); *H10B 80/00* (2023.02); *H10W 90/00* (2026.01); *H10W 90/297* (2026.01); *H10W 90/722* (2026.01)

(58) Field of Classification Search
CPC ...................................................... G11C 5/066
See application file for complete search history.

(56) References Cited

U.S. PATENT DOCUMENTS

| | | | |
|---|---|---|---|
| 7,586,801 B2 * | 9/2009 | Do | ............................ G11C 8/16 |
| | | | 365/233.5 |
| 7,684,279 B2 * | 3/2010 | Seo | ......................... G11C 5/063 |
| | | | 365/230.03 |
| 8,198,915 B2 * | 6/2012 | Yoko | ...................... H04L 25/028 |
| | | | 326/47 |
| 9,165,624 B2 * | 10/2015 | Byeon | ....................... G11C 7/18 |
| 2014/0063990 A1 | 3/2014 | Ku et al. | |

* cited by examiner

*Primary Examiner* — Amir Zarabian
*Assistant Examiner* — Anthony Thinh Tang
(74) *Attorney, Agent, or Firm* — WILLIAM PARK AND ASSOCIATES LTD.

(57) ABSTRACT

A semiconductor memory device includes a core block including a plurality of unit memory blocks, a peripheral circuit block including a data input/output pad, a through electrode configured to exchange signals with another semiconductor memory device, and a data input/output circuit coupled to the through electrode, the core block, and the peripheral circuit block and configured to share one receiver in order to transmit a signal from the through electrode to the peripheral circuit block and in order to transmit a signal from the through electrode to the core block.

18 Claims, 17 Drawing Sheets

200

<u>200</u>

101

| BK | • • • | BK |   | BK | • • • | BK |

GIO_L    GIO_R

| BK | • • • | BK |   | BK | • • • | BK |

102

103    105    106    104

DIN → | DESER |    | GIO DRV |    | GIO MUX |    | SER | ← PIN
                                                    → DOUT

210

WT_IOCELL    230    245    248    RD_IOCELL

EN3DS →
MST → | WMUX |    WT_GIOPRE    RD_GIOPOST    | RMUX | ← EN3DS
WTS →                                              ← PIN
                                            280      ← WTSB

246    GIO_IOCELL 250    241    260

| TSV TX |    ( TSV )    TSVOUT    | TSV RX |

WTS, WTSB, MST,    242    WTS, WTSB, MST,    243
MSTB, PIN          | LT |    MSTB, EN3DS,       | LT |
                           PIN_SLAVEDIE

290

| FUSE BLOCK | → EN3DS

SEMICONDUCTOR DEVICE AND STACK TYPE SEMICONDUCTOR MEMORY DEVICE INCLUDING THE SAME

CROSS-REFERENCES TO RELATED APPLICATION

The present application claims priority under 35 U.S.C. § 119 (a) to Korean Patent Application No. 10-2023-0059763, filed on May 9, 2023, in the Korean Intellectual Property Office, which is incorporated herein by reference in its entirety.

BACKGROUND

1. Technical Field

An embodiment of the present technology generally relates to a semiconductor circuit, and more particularly, to a semiconductor device and a stack type semiconductor memory device including the semiconductor device.

2. Related Art

In the recent semiconductor technology, a method of stacking a plurality of memory chips and transferring various signals through electrodes, for example, through silicon vias (TSVs) is being used.

Such a stack type semiconductor memory device requires multiple signal lines, transmission/reception circuits, etc. for transferring a signal to through electrodes and receiving a signal from the through electrodes. There is a need for the development of a technology for properly disposing the multiple signal lines, the transmission/reception circuits, etc.

SUMMARY

In an embodiment, a semiconductor memory device may include a core block including a plurality of unit memory blocks, a peripheral circuit block including a data input/output pad, a through electrode configured to exchange signals with another semiconductor memory device, and a data input/output circuit coupled to the through electrode, the core block, and the peripheral circuit block and configured to share one receiver in order to transmit a signal from the through electrode to the peripheral circuit block and in order to transmit a signal from the through electrode to the core block.

In an embodiment, a semiconductor memory device may include a core block including a plurality of unit memory blocks, a peripheral circuit block including a data input/output pad, a through electrode configured to exchange signals with another semiconductor memory device, a receiver coupled to the through electrode, and a read multiplexer configured to transmit, to the peripheral circuit block, an output signal that is output by the receiver in response to a multi-chip operation signal after the start of a read operation.

In an embodiment, a stack type semiconductor memory device may include a plurality of semiconductor chips that are coupled through a plurality of through electrodes, wherein at least one of the plurality of semiconductor chips includes a core block including a plurality of unit memory blocks, a peripheral circuit block including a data input/output pad, a through electrode configured to exchange signals with another semiconductor chip, and a data input/output circuit configured to share one receiver and one transmitter in order to exchange signals between the through electrode, the core block, and the peripheral circuit block.

DETAILED DESCRIPTION

Hereinafter, embodiments of the present technology will be described in detail with reference to the accompanying drawings.

Various embodiments of the present technology provide a semiconductor memory device capable of reducing a circuit area that is related to a through electrode and a stack type semiconductor memory device including the semiconductor memory device.

A memory system 10 according to an embodiment may be implemented in a form, such as a system in package, a multi-chip package, or a system on chip, and may also be implemented in the form of a package on package including a plurality of packages.

Figure 1:
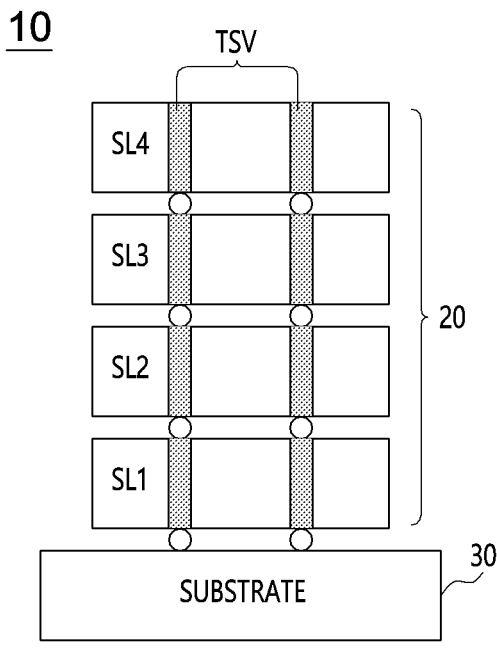
FIG. 1 is a diagram illustrating a construction of a memory system according to an embodiment.

Referring to FIG. 1, the memory system 10 according to an embodiment may include a stack type semiconductor memory device 20 and a substrate 30.

In the stack type semiconductor memory device 20, a plurality of semiconductor chips SL1 to SL4 may be stacked on the substrate 30, and may be electrically coupled through electrodes, for example, through silicon vias (TSVs).

Any one (e.g., SL1) of the plurality of semiconductor chips SL1 to SL4 may be configured to operate as a master chip, and the remaining chips SL1 to SL4 may be configured to operate as slave chips.

The plurality of semiconductor chips SL1 to SL4 may be configured to share one receiver for the transmission of a signal from the through electrodes to a peripheral circuit block and for the transmission of a signal from the through electrodes to a core block and to share one transmitter for the transmission of a signal from the core block to the through electrodes and the transmission of a signal from the peripheral circuit block to the through electrodes.

Figure 2:
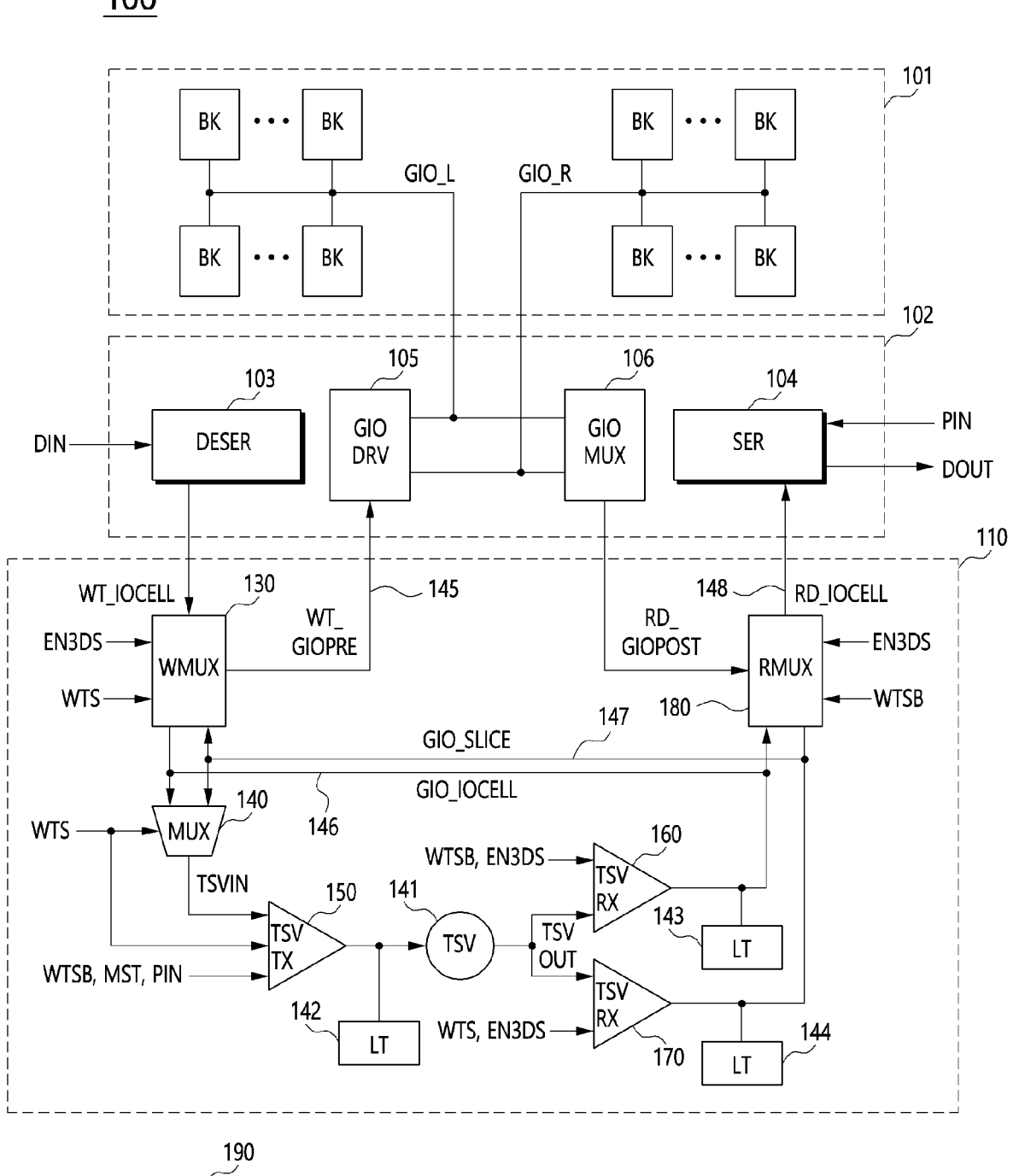
FIG. 2 is a diagram illustrating a construction of a semiconductor memory device according to an embodiment.

FIG. 2 is a diagram illustrating a construction of a semiconductor memory device 100 according to an embodiment. In an embodiment, one or more semiconductor chips (i.e., SL1 to SL4) may include a semiconductor memory device 100 included in the stack type semiconductor memory device 20 of the memory system 10.

Referring to FIG. 2, the semiconductor memory device 100 may include a core block 101, a peripheral circuit block 102, and a data input/output circuit 110. The semiconductor memory device 100 may further include a fuse block 190 for generating a multi-chip operation signal EN3DS.

The fuse block 190 may store and output the multi-chip operation signal EN3DS as a different value depending on each of cases in which the semiconductor memory device 100 operates as a single chip and operates as a multi-chip. The fuse block 190 may store the multi-chip operation signal EN3DS having a low level when the semiconductor memory device 100 operates as a single chip, and may store the multi-chip operation signal EN3DS having a high level when the semiconductor memory device 100 operates as a multi-chip.

The core block 101 may include a plurality of unit memory blocks, for example, a plurality of memory banks BK. The plurality of memory banks BK may be coupled to two sets of global input/output lines GIO_L and GIO_R. FIG. 2 merely illustrates an example in which for the plurality of memory banks BK are divided (for convenience sake, the memory banks are divided into a left memory bank group and a right memory bank group) and one set of global lines is coupled to each group, for convenience of control. The number of global input/output lines may be different depending on the number of plurality of memory banks BK.

The peripheral circuit block 102 may include a data input/output pad (not illustrated), a deserializer (DESER) 103, and a serializer (SER) 104. The peripheral circuit block 102 may further include a global line driver (GIO DRV) 105 and a global line multiplexer (GIO MUX) 106. The global line multiplexer 106 may be constructed to be suitable for the two sets of global input/output lines GIO_L and GIO_R, and may be deleted or replaced with a driver if only one set of the global input/output lines is constructed. The deserializer 103 may parallelize and output a signal of the peripheral circuit block, that is, a signal DIN that is input through the data input/output pad. The serializer 104 may output, through the data input/output pad, an output signal DOUT that is generated by serializing a signal that is output by the core block 101 in response to a pipe control signal PIN. The pipe control signal PIN may be a signal that is generated in response to a read command, and may be generated by a semiconductor chip that is now selected based on a chip identification (CID), among a plurality of semiconductor chips. The pipe control signal PIN may include at least one signal bit. The serializer 104 may include a pipe register. The number of bits of the pipe control signal PIN may be different depending on the number of stages of pipe registers.

The data input/output circuit 110 may include a write multiplexer (WMUX) 130, a multiplexer (MUX) 140, a transmitter (TSV TX) 150, a first receiver (TSV RX) 160, a second receiver (TSV RX) 170, a read multiplexer (RMUX) 180, a through electrode (TSV) 141, and a plurality of latches (LT) 142, 143, and 144.

The write multiplexer 130 may receive a multi-chip operation signal EN3DS, a write signal WTS, and a plurality of signals WT_IOCELL and GIO_SLICE, and may generate a plurality of signals WT_GIOPRE and GIO_IOCELL. The write signal WTS may be generated in response to a write command. The write signal WTS may have a high level when a write command is input and have a low level when a read command is input, regardless of the type of chip. The write multiplexer 130 may selectively output the plurality of signals WT_IOCELL and GIO_SLICE to a first self-processing signal line 145 or a first external processing signal line 146 in response to the multi-chip operation signal EN3DS and the write signal WTS.

The multiplexer 140 may receive the write signal WTS and the plurality of signals GIO_IOCELL and GIO_SLICE, and may generate an output signal TSVIN. The multiplexer 140 may select one of the plurality of signals GIO_IOCELL and GIO_SLICE in response to the write signal WTS, and may generate the selected signal as the output signal TSVIN.

The transmitter 150 may be activated in response to an inverted write signal WTSB, a master chip distinction signal MST, and the pipe control signal PIN, and may transmit the output signal TSVIN of the multiplexer 140 to the through electrode 141.

The inverted write signal WTSB may have a logic level opposite to the logic level of the write signal WTS. That is, the inverted write signal WTSB may have a low level when a write command is input, and may have a high level when a read command is input. The master chip distinction signal MST having a high level may be input when the semiconductor memory device 100 operates as a single chip. When the semiconductor memory device 100 operates as a multi-chip, the master chip distinction signal MST having a high level may be input to only the master chip SL1 (refer to FIG. 1), among all of the memory chips, and the master chip distinction signal MST having a low level may be input to the remaining chips SL2 to SL4.

The first receiver 160 may be activated in response to the inverted write signal WTSB and the multi-chip operation signal EN3DS, and may output, to the first external processing signal line 146, a signal TSVOUT that is transmitted through the through electrode 141.

The second receiver 170 may be activated in response to the write signal WTS and the multi-chip operation signal EN3DS, and may output, to a second external processing signal line 147, the signal TSVOUT that is transmitted through the through electrode 141.

The plurality of latches 142, 143, and 144 may be coupled to output terminals of the transmitter 150, the first receiver 160, and the second receiver 170, respectively, and may latch corresponding output signals, respectively.

The read multiplexer 180 may receive the multi-chip operation signal EN3DS, the inverted write signal WTSB, and the plurality of signals RD_GIOPOST and GIO_IO-CELL, and may generate a plurality of output signals RD_IOCELL and GIO_SLICE. The read multiplexer 180 may selectively output a plurality of signals RD_GIOPOST and GIO_IOCELL to a second self-processing signal line 148 or the second external processing signal line 147, in response to the multi-chip operation signal EN3DS and the inverted write signal WTSB.

Figure 3:
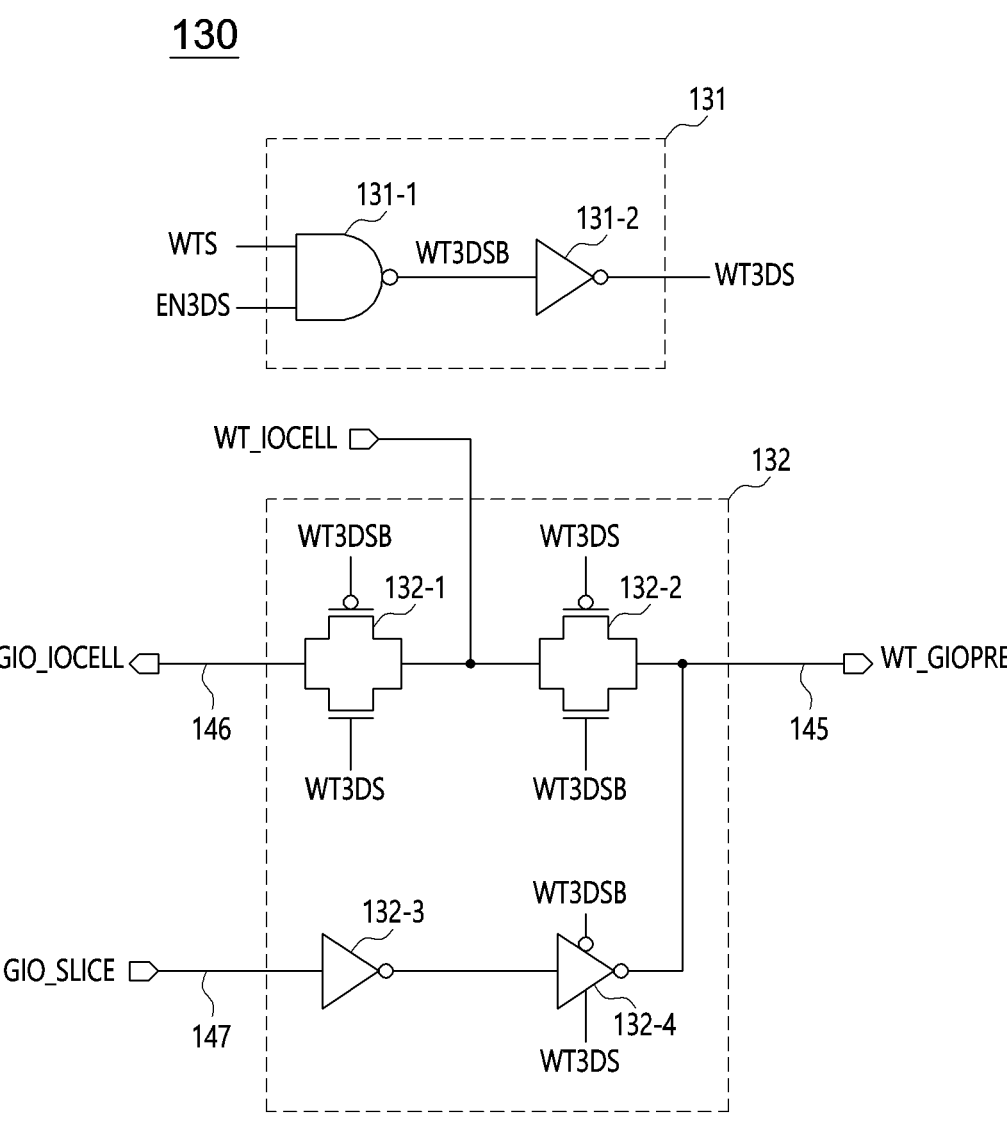
FIG. 3 is a diagram illustrating a construction of a write multiplexer in FIG. 2.

FIG. 3 is a diagram illustrating a construction of the write multiplexer 130 in FIG. 2.

Referring to FIG. 3, the write multiplexer 130 may include a control signal generation unit 131 and a multiplexing unit 132.

The control signal generation unit 131 may include first and second logic gates 131-1 and 131-2. The first and second logic gates 131-1 and 131-2 may generate a write multiplexing control signal T3DS and an inverted write multiplexing control signal WT3DSB in response to the write signal WTS and the multi-chip operation signal EN3DS. The first logic gate 131-1 may generate the inverted write multiplexing control signal WT3DSB by performing a NAND operation on the write signal WTS and the multi-chip operation signal EN3DS. The second logic gate 131-2 may generate the write multiplexing control signal WT3DS by inverting the inverted write multiplexing control signal WT3DSB. The write multiplexing control signal WT3DS and the inverted write multiplexing control signal WT3DSB may have opposite logic levels.

The multiplexing unit 132 may include first to fourth logic gates 132-1 to 132-4. When the write multiplexing control signal WT3DS has a high level, the first logic gate 132-1 may output the signal WT_IOCELL to the first external processing signal line 146 as the signal GIO_IOCELL. When the write multiplexing control signal WT3DS has a low level, the second logic gate 132-2 may output the signal WT_IOCELL to the first self-processing signal line 145 as the signal WT_GIOPRE. The third logic gate 132-3 may invert and output the signal GIO_SLICE. When the write multiplexing control signal WT3DS has a high level, the fourth logic gate 132-4 may output the signal GIO_SLICE having an original phase to the first self-processing signal line 145 as the signal WT_GIOPRE by inverting the output of the third logic gate 132-3.

Figure 4:
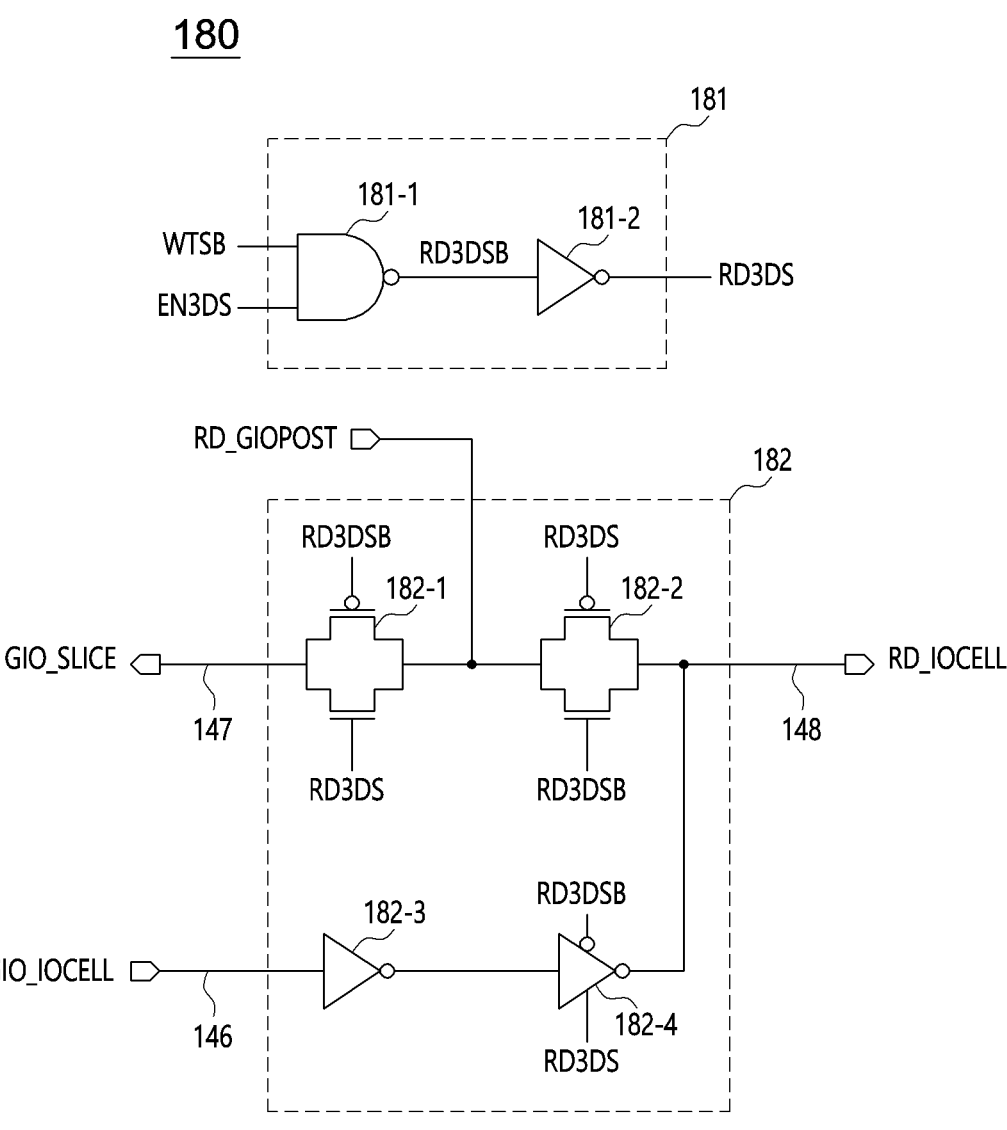
FIG. 4 is a diagram illustrating a construction of a read multiplexer in FIG. 2.

Referring to FIG. 4, the read multiplexer 180 may include a control signal generation unit 181 and a multiplexing unit 182.

The control signal generation unit 181 may include first and second logic gates 181-1 and 181-2. The first and second logic gates 181-1 and 181-2 may generate a read multiplexing control signal RD3DS and an inverted read multiplexing control signal RD3DSB in response to the inverted write signal WTSB and the multi-chip operation signal EN3DS. The first logic gate 181-1 may generate the inverted read multiplexing control signal RD3DSB by performing a NAND operation on the inverted write signal WTSB and the multi-chip operation signal EN3DS. The second logic gate 181-2 may generate the read multiplexing control signal RD3DS by inverting the inverted read multiplexing control signal RD3DSB. The read multiplexing control signal RD3DS and the inverted read multiplexing control signal RD3DSB may have opposite logic levels. The read multiplexing control signal RD3DS may have a high level and the inverted read multiplexing control signal RD3DSB may have a low level because the multi-chip operation signal EN3DS and the inverted write signal WTSB have a high level only when the semiconductor memory device 100 operates as a multi-chip and is in a read operation state.

The multiplexing unit 182 may include first to fourth logic gates 182-1 to 182-4. When the read multiplexing control signal RD3DS has a high level, the first logic gate 182-1 may output an signal RD_GIOPOST to the second external processing signal line 147 as the signal GIO_SLICE. When the read multiplexing control signal RD3DS has a low level, the second logic gate 182-2 may output the signal RD_GIOPOST to the second self-processing signal line 148 as the signal RD_IOCELL. The third logic gate 182-3 may invert and output the signal GIO_IOCELL. When the read multiplexing control signal RD3DS has a high level, the fourth logic gate 182-4 may output the output of the third logic gate 182-3 to the second self-processing signal line 148 as the signal RD_IOCELL.

Figure 5:
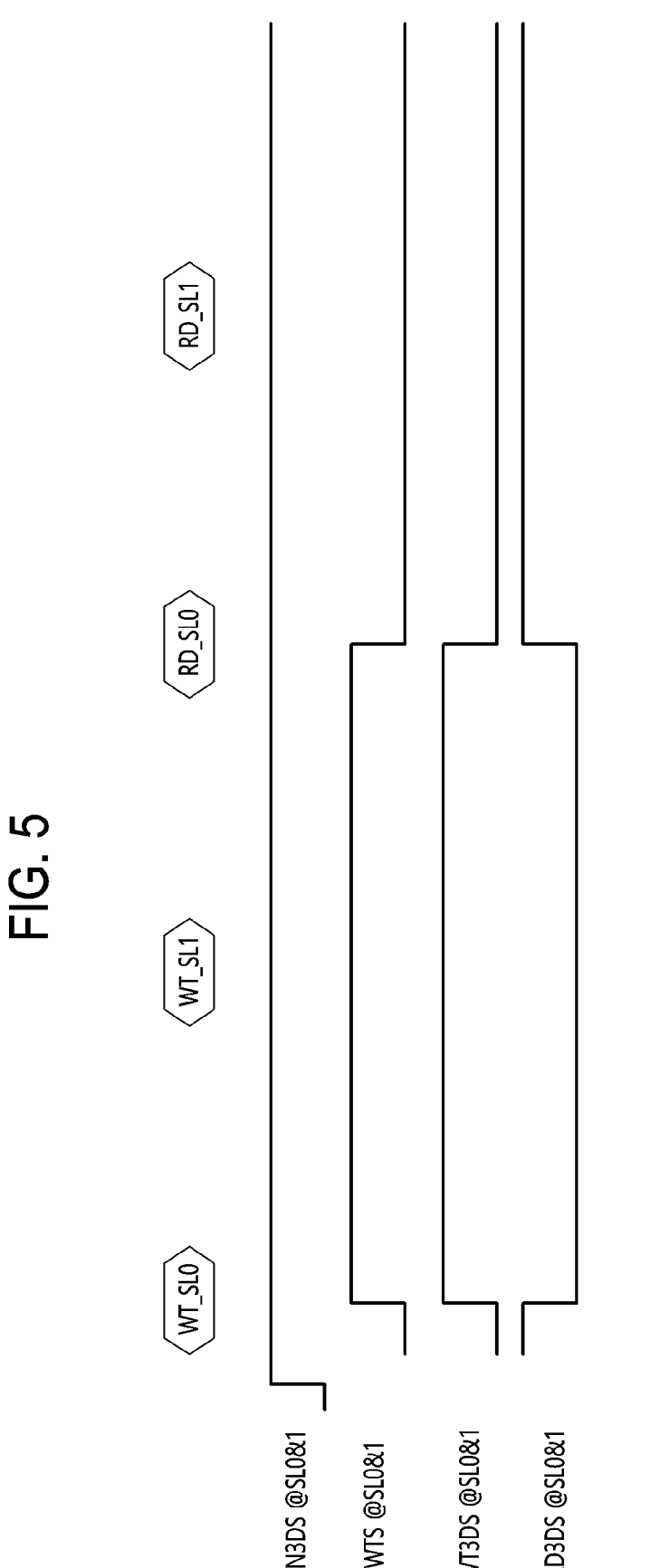
FIG. 5 is an operation timing diagram of the write multiplexer and the read multiplexer.

FIG. 5 is an operation timing diagram of the write multiplexer 130 and the read multiplexer 180.

Operations of the write multiplexer 130 and the read multiplexer 180 are described with reference to FIG. 5.

It is assumed that the semiconductor memory device 100 operates as a multi-chip including the master chip SL1 and the slave chip SL1 and sequential write commands WT_SL1 and WT_SL1 and sequential read commands RD_SL1 and RD_SL1 for the master chip SL1 and the slave chip SL1 have been input.

A multi-chip operation signal EN3DS @SL1&1 having a high level may be input to the master chip SL1 and the slave chip SL1 because the master chip SL1 and the slave chip SL1 have a multi-chip structure.

Since the write signal WTS (i.e., WTS @SL1&1) has a high level in response to the write commands WT_SL1 and WT_SL1, the write multiplexing control signal WT3DS (i.e., WT3DS @SL1&1) may have a high level and the inverted write multiplexing control signal WT3DSB may have a low level. The write multiplexer 130 may output the signal WT_IOCELL to the first external processing signal line 146 as the signal GIO_IOCELL and output the signal GIO_SLICE to the first self-processing signal line 145 as the signal WT_GIOPRE, in response to the write multiplexing control signal WT3DS having a high level.

Since the write signal WTS has a low level in response to the read commands RD_SL1 and RD_SL1, the read multiplexing control signal RD3DS (i.e., RD3DS @SL1&1) may have a high level and the inverted read multiplexing control signal RD3DSB may have a low level. The read multiplexer 180 may output the signal RD_GIOPOST to the second external processing signal line 147 as the signal GIO_SLICE and output the signal GIO_IOCELL to the second self-processing signal line 148 as the signal RD_IOCELL, in response to the read multiplexing control signal RD3DS having a high level.

Figure 6:
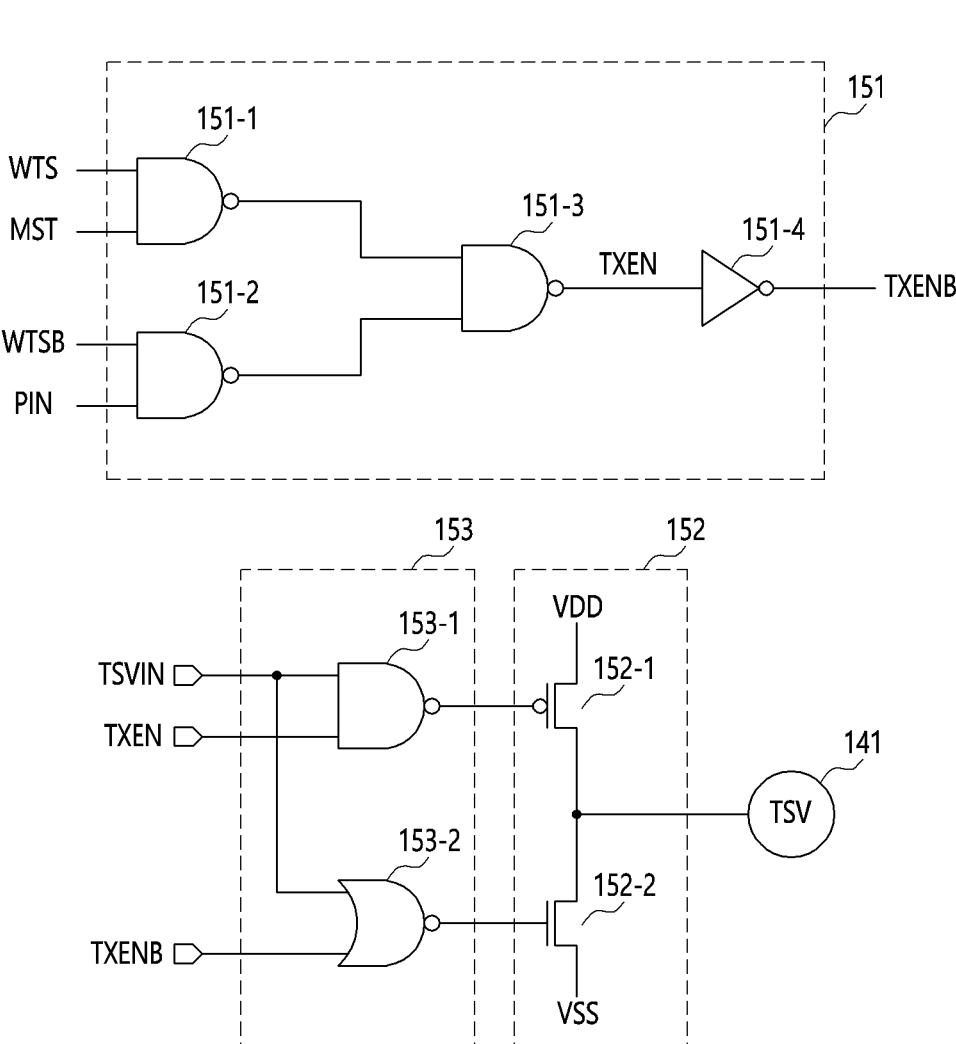
FIG. 6 is a diagram illustrating a construction of a transmitter in FIG. 2.

FIG. 6 is a diagram illustrating a construction of the transmitter 150 in FIG. 2.

Referring to FIG. 6, the transmitter 150 may include a control signal generation unit 151, a driver 152, and a driver control unit 153.

The control signal generation unit 151 may generate a transmission enable signal TXEN and an inverted transmission enable signal TXENB, in response to the write signal WTS, the master chip distinction signal MST, the inverted write signal WTSB, and the pipe control signal PIN. The control signal generation unit 151 may include first to fourth logic gates 151-1 to 151-4. The first logic gate 151-1 may output the write signal WTS and the master chip distinction signal MST by performing a NAND operation on the write signal WTS and the master chip distinction signal MST. The second logic gate 151-2 may output the inverted write signal WTSB and the pipe control signal PIN by performing a NAND operation on the inverted write signal WTSB and the pipe control signal PIN. The third logic gate 151-3 may output, as the transmission enable signal TXEN, the results of a NAND operation on the output of the first logic gate 151-1 and the output of the second logic gate 151-2. The fourth logic gate 151-4 may output the transmission enable signal TXEN as the inverted transmission enable signal TXENB by inverting the transmission enable signal TXEN.

The driver 152 may drive the through electrode 141. The driver 152 may include first and second transistors 152-1 and 152-2 that are coupled between a power supply terminal VDD and the ground terminal VSS. An output terminal of the driver 152, that is, drain terminals of the first and second transistors 152-1 and 152-2, may be coupled to the through electrode 141.

The driver control unit 153 may control the driver 152 in response to the output signal TSVIN of the multiplexer 140, the transmission enable signal TXEN, and the inverted transmission enable signal TXENB. The driver control unit 153 may include first and second logic gates 153-1 and 153-2. The first logic gate 153-1 may control the first transistor 152-1 of the driver 152, based on the results of a NAND operation on the output signal TSVIN of the multiplexer 140 and the transmission enable signal TXEN. The second logic gate 153-2 may control the second transistor 152-2 of the driver 152, based on the results of a NOR operation on the output signal TSVIN of the multiplexer 140 and the inverted transmission enable signal TXENB.

Figure 7:
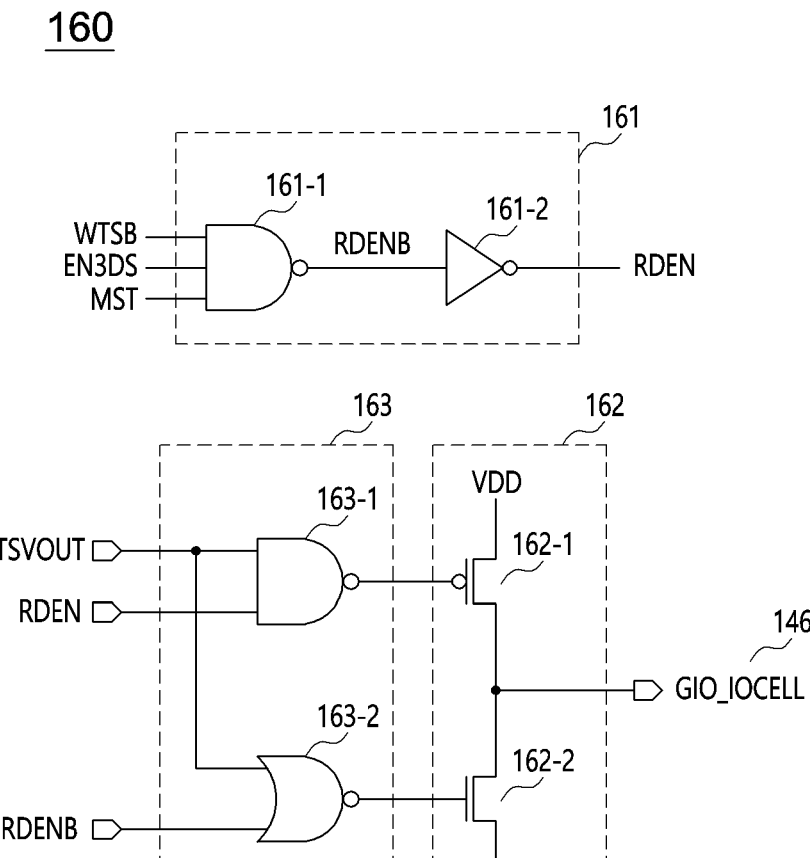
FIG. 7 is a diagram illustrating a construction of a first receiver in FIG. 2.

FIG. 7 is a diagram illustrating a construction of the first receiver 160 in FIG. 2.

Referring to FIG. 7, the first receiver 160 may include a control signal generation unit 161, a driver 162, and a driver control unit 163.

The control signal generation unit 161 may generate a read enable signal RDEN and an inverted read enable signal RDENB, in response to the inverted write signal WTSB, the multi-chip operation signal EN3DS, and the master chip distinction signal MST. The control signal generation unit 161 may include first and second logic gates 161-1 and 161-2. The first logic gate 161-1 may output, as the inverted read enable signal RDENB, the results of a NAND operation on the inverted write signal WTSB, the multi-chip operation signal EN3DS, and the master chip distinction signal MST. The second logic gate 161-2 may output the inverted read enable signal RDENB as the read enable signal RDEN by inverting the inverted read enable signal RDENB.

The driver 162 may drive the first external processing signal line 146 to be suitable for the signal GIO_IOCELL. The driver 162 may include first and second transistors 162-1 and 162-2 that are coupled between the power supply terminal VDD and the ground terminal VSS. An output terminal of the driver 162, that is, drain terminals of the first and second transistors 162-1 and 162-2, may be coupled to the first external processing signal line 146.

The driver control unit 163 may control the driver 162, in response to the signal TSVOUT that is transmitted through the through electrode 141, the read enable signal RDEN, and the inverted read enable signal RDENB. The driver control unit 163 may include first and second logic gates 163-1 and 163-2. The first logic gate 163-1 may control the first transistor 162-1 of the driver 162, based on the results of a NAND operation on the signal TSVOUT that is transmitted through the through electrode 141 and the read enable signal RDEN. The second logic gate 163-2 may control the second transistor 162-2 of the driver 162, based on the results of a NOR operation on the signal TSVOUT that is transmitted through the through electrode 141 and the inverted read enable signal RDENB.

Figure 8:
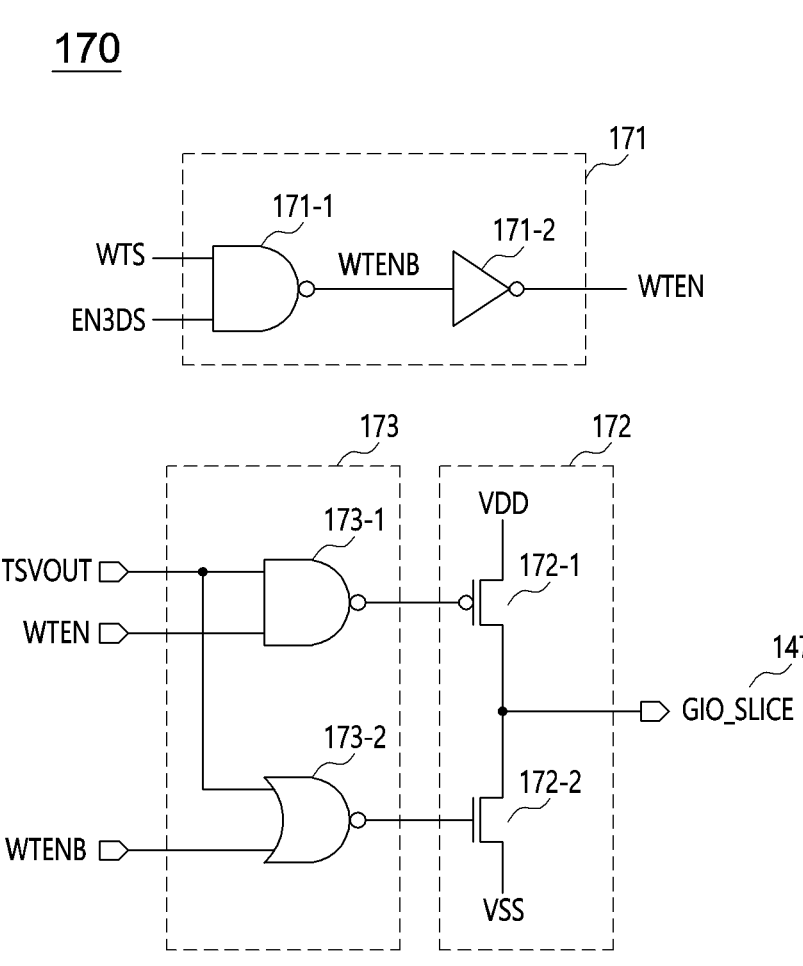
FIG. 8 is a diagram illustrating a construction of a second receiver in FIG. 2.

FIG. 8 is a diagram illustrating a construction of the second receiver 170 in FIG. 2.

Referring to FIG. 8, the second receiver 170 may include a control signal generation unit 171, a driver 172, and a driver control unit 173.

The control signal generation unit 171 may generate a write enable signal WTEN and an inverted write enable signal WTENB, in response to the write signal WTS and the multi-chip operation signal EN3DS. The control signal generation unit 171 may include first and second logic gates 171-1 and 171-2. The first logic gate 171-1 may output, as the inverted write enable signal WTENB, the results of a NAND operation on the write signal WTS and the multi-chip operation signal EN3DS. The second logic gate 171-2 may output the inverted write enable signal WTENB as the write enable signal WTEN by inverting the inverted write enable signal WTENB.

The driver 172 may drive the second external processing signal line 147 to be suitable for the signal GIO_SLICE. The driver 172 may include first and second transistors 172-1 and 172-2 that are coupled between the power supply terminal VDD and the ground terminal VSS. An output terminal of the driver 172, that is, drain terminals of the first and second transistors 172-1 and 172-2, may be coupled to the second external processing signal line 147.

The driver control unit 173 may control the driver 162, in response to the signal TSVOUT that is transmitted through the through electrode 141, the write enable signal WTEN, and the inverted write enable signal WTENB. The driver control unit 173 may include first and second logic gates 173-1 and 173-2. The first logic gate 173-1 may control the first transistor 172-1 of the driver 172, based on the results of a NAND operation on the signal TSVOUT that is transmitted through the through electrode 141 and the write enable signal WTEN. The second logic gate 173-2 may control the second transistor 172-2 of the driver 172, based on the results of a NOR operation on the signal TSVOUT that is transmitted through the through electrode 141 and the inverted write enable signal WTENB.

Figure 9:
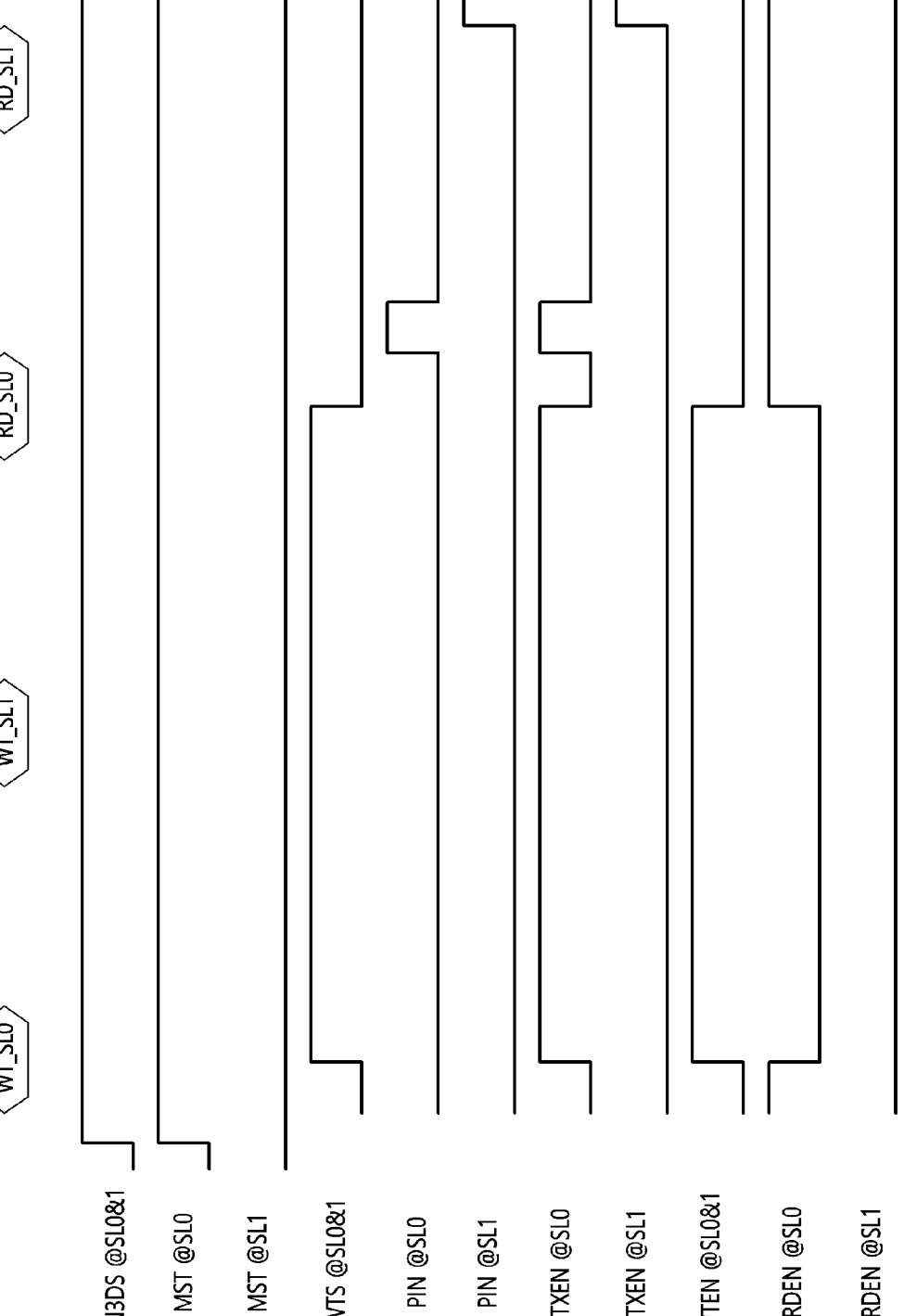
FIG. 9 is an operation timing diagram of the transmitter, the first receiver, and the second receiver in FIG. 2.

FIG. 9 is an operation timing diagram of the transmitter 150, the first receiver 160, and the second receiver 170 in FIG. 2.

Operations of the transmitter 150, the first receiver 160, and the second receiver 170 are described with reference to FIG. 9.

It is assumed that the semiconductor memory device 100 operates as a multi-chip including the master chip SL1 and the slave chip SL1 and sequential write commands WT_SL1 and WT_SL1 and sequential read commands RD_SL1 and RD_SL1 for the master chip SL1 and the slave chip SL1 have been input.

A multi-chip operation signal EN3DS@SL1&1 having a high level may be input to the master chip SL1 and the slave chip SL1 because the master chip SL1 and the slave chip SL1 have a multi-chip structure.

The master chip distinction signal MST having a high level may be input to the master chip SL1, and the master chip distinction signal MST having a low level may be input to the slave chip SL1. The write signal WTS having a high level may be input to the master chip SL1 and the slave chip SL1 in response to the write commands WT_SL1 and WT_SL1.

Since the master chip distinction signal MST having a high level is input, the master chip SL1 may generate the transmission enable signal TXEN having a high level, during an interval in which the write signal WTS has a high level and during an interval in which the pipe control signal PIN has a high level.

Since the master chip distinction signal MST having a low level is input, the slave chip SL1 may generate the transmission enable signal TXEN having a high level during an interval in which the write signal WTS has a low level and the pipe control signal PIN has a high level.

The transmitter 150 of the master chip SL1 and the slave chip SL1 may transmit the output signal TSVIN of the multiplexer 140 to the through electrode 141 during the interval in which the transmission enable signal TXEN has a high level.

The master chip SL1 and the slave chip SL1 may generate the write enable signal WTEN having a high level during the interval in which the write signal WTS has a high level.

The second receiver 170 of the master chip SL1 and the slave chip SL1 may output, to the second external processing signal line 147, the signal TSVOUT that is transmitted through the through electrode 141 during the interval in which the write enable signal WTEN has a high level.

The inverted write signal WTSB having a high level may be input in response to the read commands RD_SL1 and RD_SL1.

Since the master chip distinction signal MST having a high level is input, the master chip SL1 may generate the read enable signal RDEN having a high level during an interval in which the inverted write signal WTSB has a high level.

Since the master chip distinction signal MST having a low level is input, the slave chip SL1 may generate the read enable signal RDEN having a low level regardless of the level of the inverted write signal WTSB.

The first receiver 160 of the master chip SL1 may output the signal TSVOUT that is transmitted through the through electrode 141 to the first external processing signal line 146 during an interval in which the read enable signal RDEN has a high level. The first receiver 160 of the slave chip SL1 may be deactivated because the read enable signal RDEN has a low level.

Figure 10:
FIG. 10 is a diagram illustrating a construction of a semiconductor memory device according to another embodiment.
Figure 10:
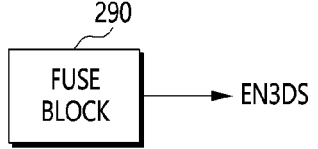

FIG. 10 is a diagram illustrating a construction of a semiconductor memory device 200 according to another embodiment.

Referring to FIG. 10, the semiconductor memory device 200 may include a core block 101, a peripheral circuit block 102, and a data input/output circuit 210. The semiconductor memory device 200 may further include a fuse block 290 for generating a multi-chip operation signal EN3DS.

The core block 101, the peripheral circuit block 102, and the fuse block 190 may have the same constructions as those in FIG. 2, and descriptions thereof are omitted.

The data input/output circuit 210 may include a write multiplexer (WMUX) 230, a transmitter (TSV TX) 250, a receiver (TSV RX) 260, a read multiplexer (RMUX) 280, a through electrode (TSV) 241, and a plurality of latches (LT) 242 and 243.

The write multiplexer 230 may receive the multi-chip operation signal EN3DS, a write signal WTS, a master chip distinction signal MST, and a plurality of signals, and may generate a plurality of signals WT_GIOPRE and GIO_IO-CELL. The write multiplexer 130 may selectively output the plurality of signals to a first self-processing signal line 245 or an external processing signal line 246, in response to the multi-chip operation signal EN3DS, the write signal WTS, and the master chip distinction signal MST. The external processing signal line 246 may be shared by the write multiplexer 230, the transmitter 250, the receiver 260, and the read multiplexer 280.

The transmitter 250 may be activated in response to the write signal WTS, an inverted write signal WTSB, the master chip distinction signal MST, an inverted master chip distinction signal MSTB, and a pipe control signal PIN, and may transmit a signal of the external processing signal line 246 to the through electrode 241.

The receiver 260 may be activated in response to the write signal WTS, the inverted write signal WTSB, the multi-chip operation signal EN3DS, the master chip distinction signal MST, the inverted master chip distinction signal MSTB, and another chip pipe control signal PIN_SLAVEDIE, and may output a signal TSVOUT that is transmitted through the through electrode 241 to the external processing signal line 246. The another chip pipe control signal PIN_SLAVEDIE may be a pipe control signal that is generated by a slave chip corresponding to a CID according to a read command, among the remaining slave chips, except the master chip SL1.

The plurality of latches 242 and 243 may be coupled to output terminals of the transmitter 250 and the receiver 260, respectively, and may latch corresponding output signals.

The read multiplexer 280 may receive the multi-chip operation signal EN3DS, the inverted write signal WTSB, the pipe control signal PIN, and the plurality of signals, and may generate a plurality of output signals RD_IOCELL and GIO_IOCELL. The read multiplexer 280 may selectively output the plurality of signals to the second self-processing signal line 248 or the external processing signal line 246, in response to the multi-chip operation signal EN3DS, the inverted write signal WTSB, and the pipe control signal PIN.

Figure 11:
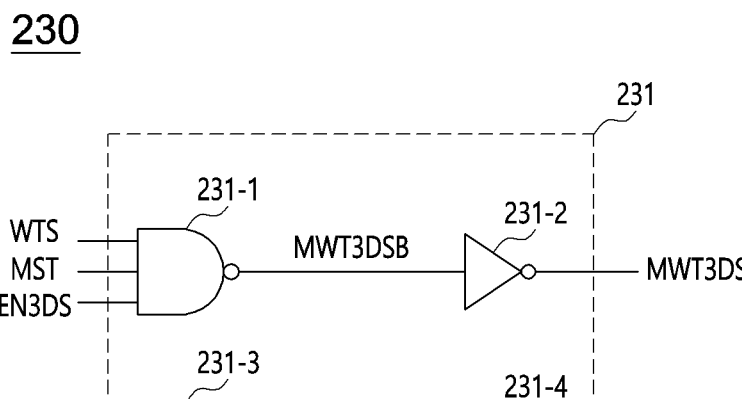
FIG. 11 is a diagram illustrating a construction of a write multiplexer in FIG. 10.
Figure 11:
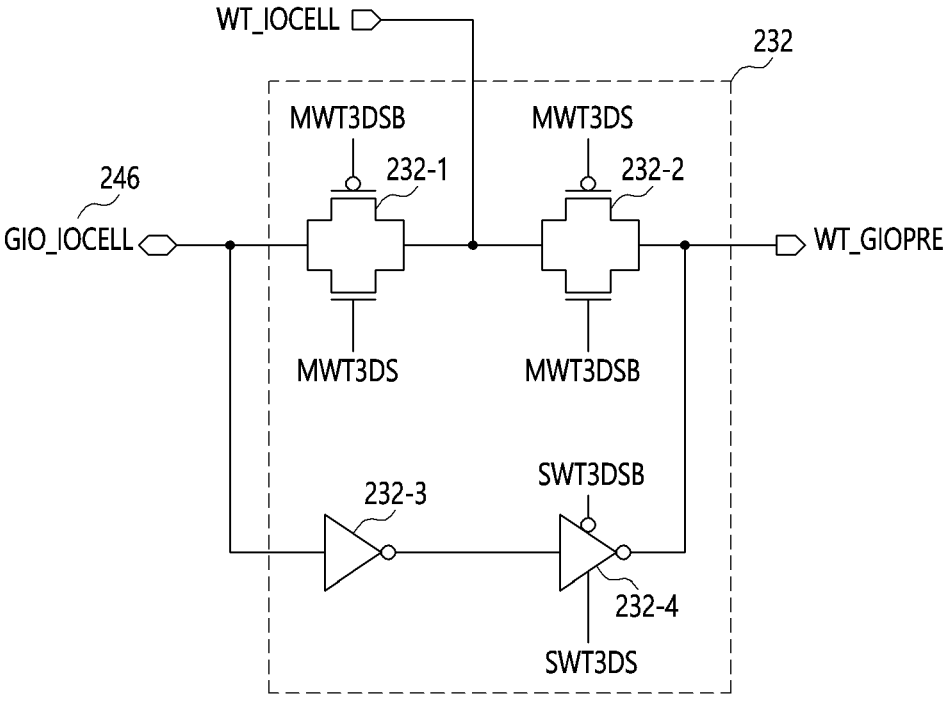

FIG. 11 is a diagram illustrating a construction of the write multiplexer 230 in FIG. 10.

Referring to FIG. 11, the write multiplexer 230 may include a control signal generation unit 231 and a multiplexing unit 232.

The control signal generation unit 231 may include first to fourth logic gates 231-1 to 231-4. The first to fourth logic gates 231-1 to 231-4 may generate a first write multiplexing control signal MWT3DS, an inverted first write multiplexing control signal MWT3DSB, a second write multiplexing control signal SWT3DS, and an inverted second write multiplexing control signal SWT3DSB, in response to the multi-chip operation signal EN3DS, the write signal WTS, and the master chip distinction signal MST. The first logic gate 231-1 may generate the inverted first write multiplexing control signal MWT3DSB by performing a NAND operation on the multi-chip operation signal EN3DS, the write signal WTS, and the master chip distinction signal MST. The second logic gate 231-2 may generate the first write multiplexing control signal MWT3DS by inverting the inverted first write multiplexing control signal MWT3DSB. The third logic gate 231-3 may generate the inverted second write multiplexing control signal SWT3DSB by performing a NAND operation on the write signal WTS and the master chip distinction signal MST. The fourth logic gate 231-4 may generate the second write multiplexing control signal SWT3DS by inverting the inverted second write multiplexing control signal SWT3DSB.

The multiplexing unit 232 may include first to fourth logic gates 232-1 to 232-4. When the first write multiplexing control signal MWT3DS has a high level, the first logic gate 232-1 may output an signal WT_IOCELL to the external processing signal line 246 as the signal GIO_IOCELL. When the first write multiplexing control signal MWT3DS has a high level, the second logic gate 232-2 might not transmit the signal WT_IOCELL. When the first write multiplexing control signal MWT3DS has a low level, the second logic gate 232-2 may output the signal WT_IOCELL to the first self-processing signal line 245 as the signal WT_GIOPRE. The third logic gate 232-3 may output the output of the first logic gate 232-1 by inverting the output of the first logic gate 232-1. When the second write multiplexing control signal SWT3DS has a high level, the fourth logic gate 232-4 may output the output of the third logic gate 232-3 to the first self-processing signal line 245 as the signal WT_GIOPRE by inverting the output of the third logic gate 232-3.

Figure 12:
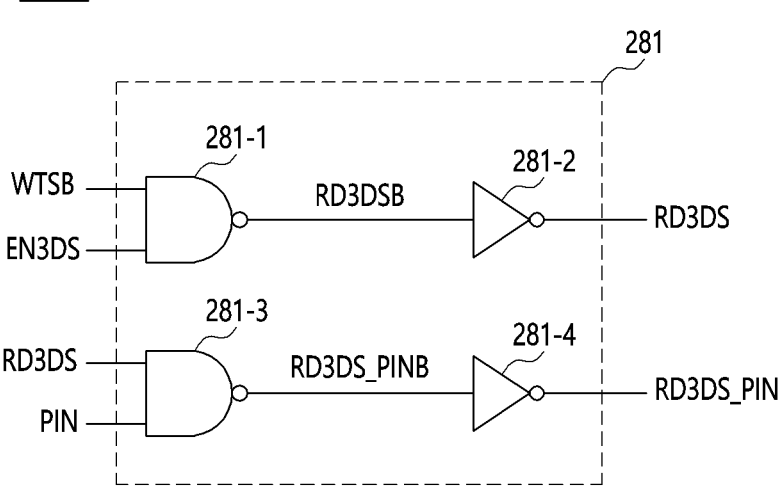
FIG. 12 is a diagram illustrating a construction of a read multiplexer in FIG. 10.
Figure 12:
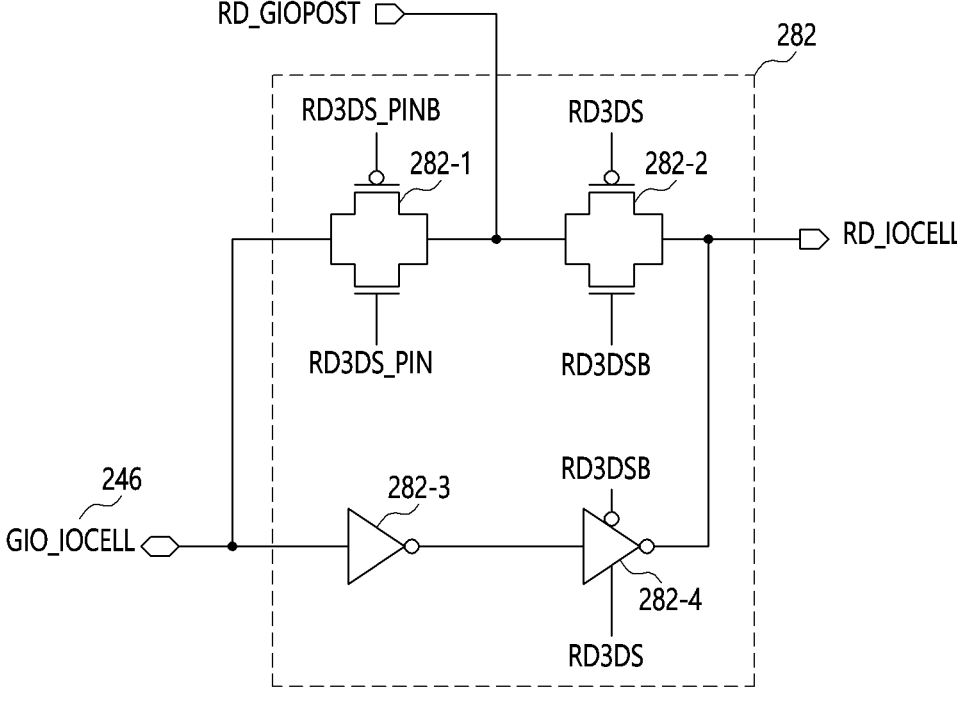

FIG. 12 is a diagram illustrating a construction of the read multiplexer 280 in FIG. 10.

Referring to FIG. 12, the read multiplexer 280 may include a control signal generation unit 281 and a multiplexing unit 282.

The control signal generation unit 281 may include first to fourth logic gates 281-1 to 281-4. the first to fourth logic gates 281-1 to 281-4 may generate a read multiplexing control signal RD3DS, an inverted read multiplexing control signal RD3DSB, a read multiplexing delay control signal RD3DS_PIN, and an inverted read multiplexing delay control signal RD3DS_PINB, in response to the inverted write signal WTSB, the multi-chip operation signal EN3DS, and the pipe control signal PIN. The first logic gate 281-1 may generate the inverted read multiplexing control signal RD3DSB by performing a NAND operation on the inverted write signal WTSB and the multi-chip operation signal EN3DS. The second logic gate 281-2 may generate the read multiplexing control signal RD3DS by inverting the inverted read multiplexing control signal RD3DSB. The third logic gate 281-3 may generate the inverted read multiplexing delay control signal RD3DS_PINB by performing a NAND operation on the read multiplexing control signal RD3DS and the pipe control signal PIN. The fourth logic gate 281-4 may generate the read multiplexing delay control signal RD3DS_PIN by inverting the inverted read multiplexing delay control signal RD3DS_PINB.

The multiplexing unit 282 may include first to fourth logic gates 282-1 to 282-4. When the read multiplexing delay control signal RD3DS_PIN has a high level, the first logic gate 282-1 may output an signal RD_GIOPOST to the external processing signal line 246 as the signal GIO_IO-CELL. The second logic gate 282-2 might not transmit the signal RD_GIOPOST when the read multiplexing control signal RD3DS has a high level, and may output the signal RD_GIOPOST to the second self-processing signal line 248 as the signal RD_IOCELL when the read multiplexing control signal RD3DS has a low level. The third logic gate 282-3 may output the output of the first logic gate 282-1 by inverting the output of the first logic gate 282-1. When the read multiplexing control signal RD3DS has a high level, the fourth logic gate 282-4 may output the output of the third logic gate 282-3 to the second self-processing signal line 248 as the signal RD_IOCELL.

Figure 13:
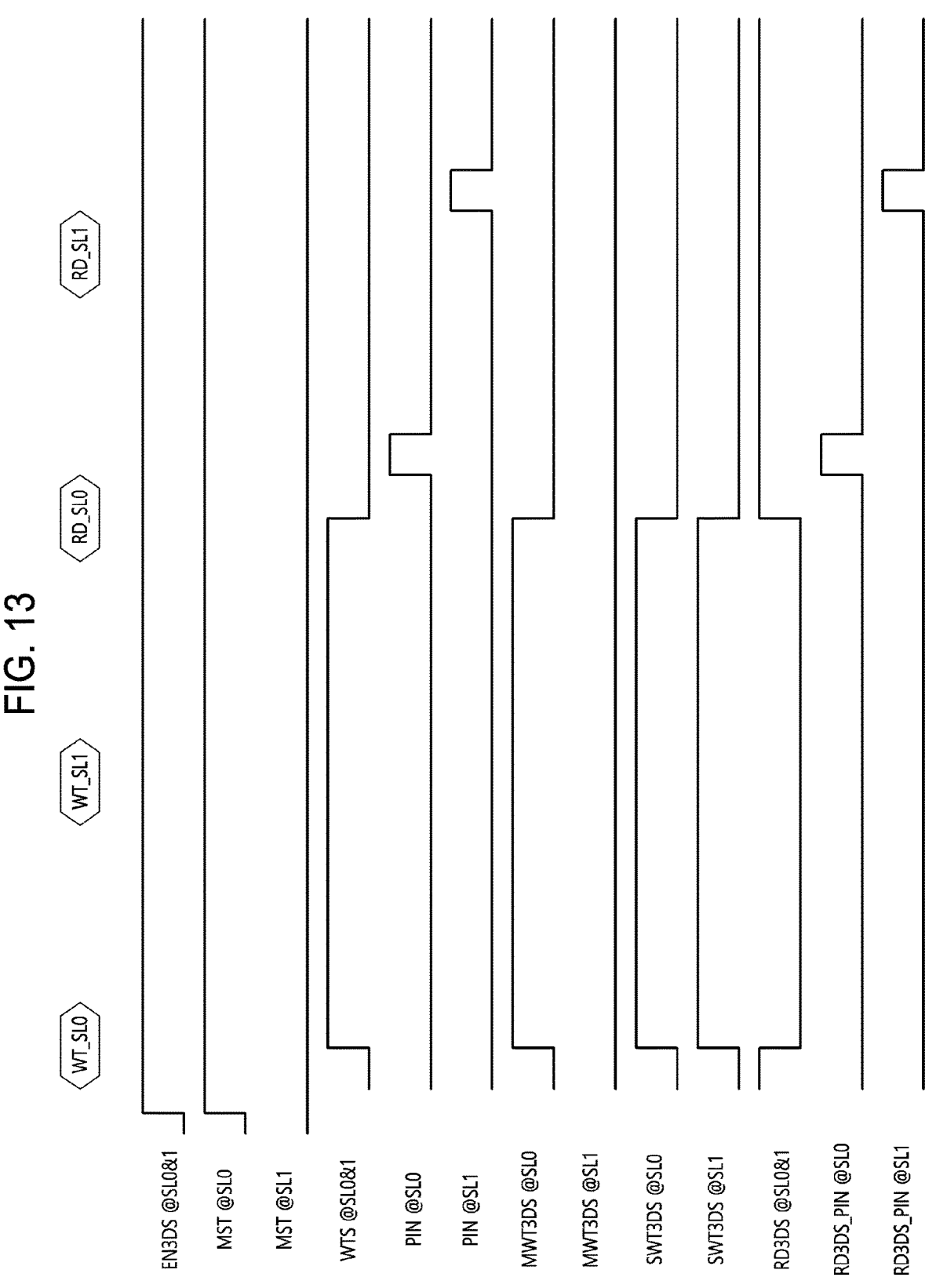
FIG. 13 is an operation timing diagram of the write multiplexer and the read multiplexer.

FIG. 13 is an operation timing diagram of the write multiplexer 230 and the read multiplexer 280.

Operations of the write multiplexer 230 and the read multiplexer 280 are described with reference to FIG. 13.

It is assumed that the semiconductor memory device 200 operates as a multi-chip including the master chip SL1 and the slave chip SL1 and sequential write commands WT_SL1 and WT_SL1 and sequential read commands RD_SL1 and RD_SL1 for the master chip SL1 and the slave chip SL1 have been input.

A multi-chip operation signal EN3DS@SL1&1 having a high level may be input to the master chip SL1 and the slave chip SL1 because the master chip SL1 and the slave chip SL1 have a multi-chip structure.

The master chip distinction signal MST having a high level may be input to the master chip SL1. The master chip distinction signal MST having a low level may be input to the slave chip SL1. The write signal WTS having a high level may be input to the master chip SL1 and the slave chip SL1 in response to the write commands WT_SL1 and WT_SL1.

Since the write signal WTS has a high level, the first write multiplexing control signal MWT3DS of the master chip SL1 may have a high level, and the first write multiplexing control signal MWT3DS of the slave chip SL1 may have a low level. The second write multiplexing control signal SMWT3DS may have a high level in both the master chip SL1 and the slave chip SL1.

The write multiplexer 230 of the master chip SL1 may output the signal WT_IOCELL to the external processing signal line 246 as the signal GIO_IOCELL in response to the first write multiplexing control signal MWT3DS having a high level, and may output the signal WT_IOCELL to the first self-processing signal line 245 as the signal WT_GIO-PRE in response to the second write multiplexing control signal SMWT3DS having a high level.

Since the first write multiplexing control signal MWT3DS has a low level, the write multiplexer 230 of the slave chip SL1 may output the another signal GIO_IOCELL to the first self-processing signal line 245 as the signal WT_GIOPRE in response to the second write multiplexing control signal SMWT3DS having a high level.

After the start of a write operation for the slave chip SL1, the write multiplexer 230 of the slave chip SL1 may block the input WT_IOCELL from the peripheral circuit block 102 by using the second logic gate 232-2.

Since the write signal WTS has a low level in response to the read commands RD_SL1 and RD_SL1, the read multiplexing control signal RD3DS may have a high level regardless of the type of semiconductor chip. The read multiplexing delay control signal RD3DS_PIN may be activated at timing at which the pipe control signal PIN of each of the master chip SL1 and the slave chip SL1 is activated. The read multiplexer 280 of the master chip SL1 or the slave chip SL1 for which the read multiplexing delay control signal RD3DS_PIN has a high level may output the signal RD_G-IOPOST to the external processing signal line 246. The read multiplexer 280 of all of the semiconductor chips may output a signal of the external processing signal line 246 to the second self-processing signal line 248 as the signal RD_IOCELL in response to the read multiplexing control signal RD3DS having a high level.

After the start of a read operation for the slave chip SL1, the read multiplexer 280 of the master chip SL1 may block the input RD_GIOPOST from the core block 101 by using the second logic gate 282-2.

Figure 14:
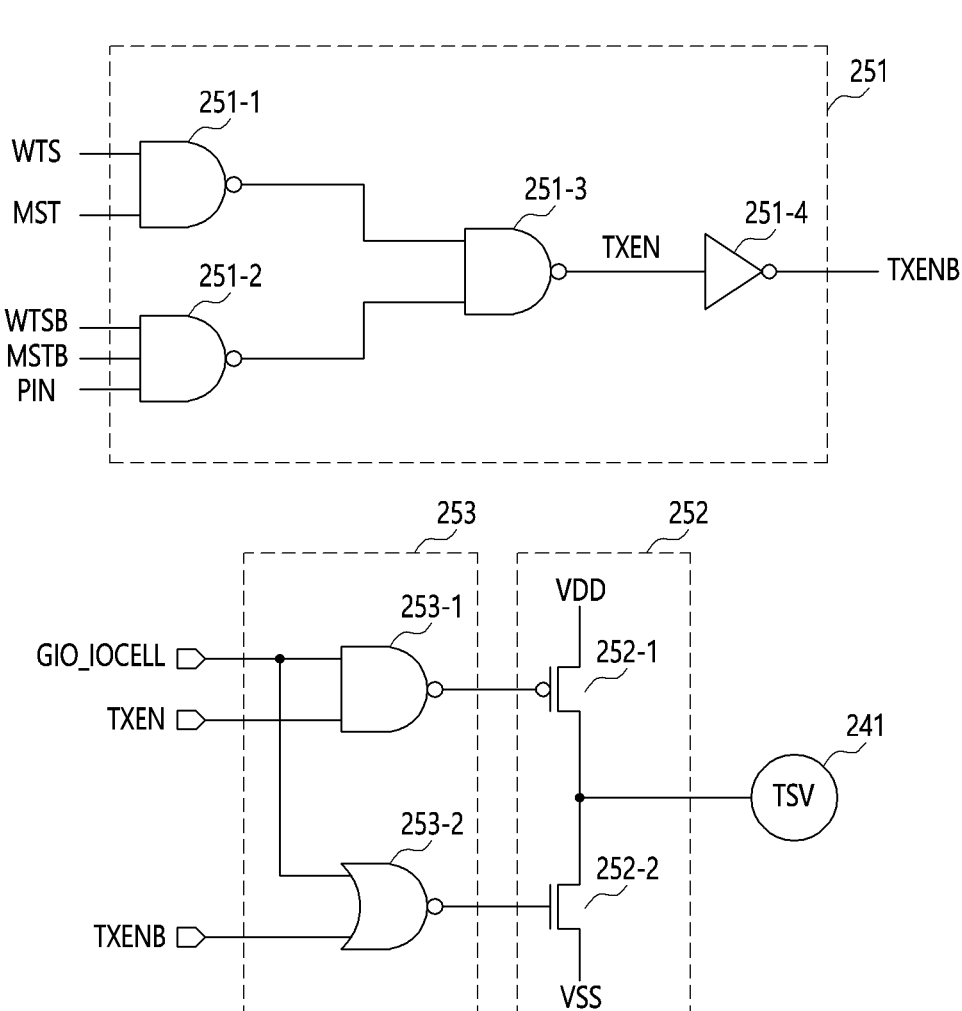
FIG. 14 is a diagram illustrating a construction of a transmitter in FIG. 10.

FIG. 14 is a diagram illustrating a construction of the transmitter 250 in FIG. 10.

Referring to FIG. 14, the transmitter 250 may include a control signal generation unit 251, a driver 252, and a driver control unit 253.

The control signal generation unit 251 may generate a transmission enable signal TXEN and an inverted transmission enable signal TXENB, in response to the write signal WTS, the master chip distinction signal MST, the inverted write signal WTSB, the inverted master chip distinction signal MSTB, and the pipe control signal PIN. The control signal generation unit 251 may include first to fourth logic gates 251-1 to 251-4. The first logic gate 251-1 may output the write signal WTS and the master chip distinction signal MST by performing a NAND operation on the write signal WTS and the master chip distinction signal MST. The second logic gate 251-2 may output the inverted write signal WTSB, the inverted master chip distinction signal MSTB, and the pipe control signal PIN by performing a NAND operation on the inverted write signal WTSB, the inverted master chip distinction signal MSTB, and the pipe control signal PIN. The third logic gate 251-3 may output, as the transmission enable signal TXEN, the results of a NAND operation on the output of the first logic gate 251-1 and the output of the second logic gate 251-2. The fourth logic gate 251-4 may output the transmission enable signal TXEN as the inverted transmission enable signal TXENB by inverting the transmission enable signal TXEN.

The driver 252 may drive a through electrode 241. The driver 252 may include first and second transistors 252-1 and 252-2 that are coupled between the power supply terminal VDD and the ground terminal VSS. An output terminal of the driver 252, that is, drain terminals of the first and second transistors 252-1 and 252-2, may be coupled to the through electrode 241.

The driver control unit 253 may control the driver 252 in response to the signal GIO_IOCELL of the external processing signal line 246, the transmission enable signal TXEN, and the inverted transmission enable signal TXENB. The driver control unit 253 may include first and second logic gates 253-1 and 253-2. The first logic gate 253-1 may control the first transistor 252-1 of the driver 252 based on the results of a NAND operation on the signal GIO_IO-CELL and the transmission enable signal TXEN. The second logic gate 253-2 may control the second transistor 252-2 of the driver 252 based on the results of a NOR operation on the signal GIO_IOCELL and the inverted transmission enable signal TXENB.

Figure 15:
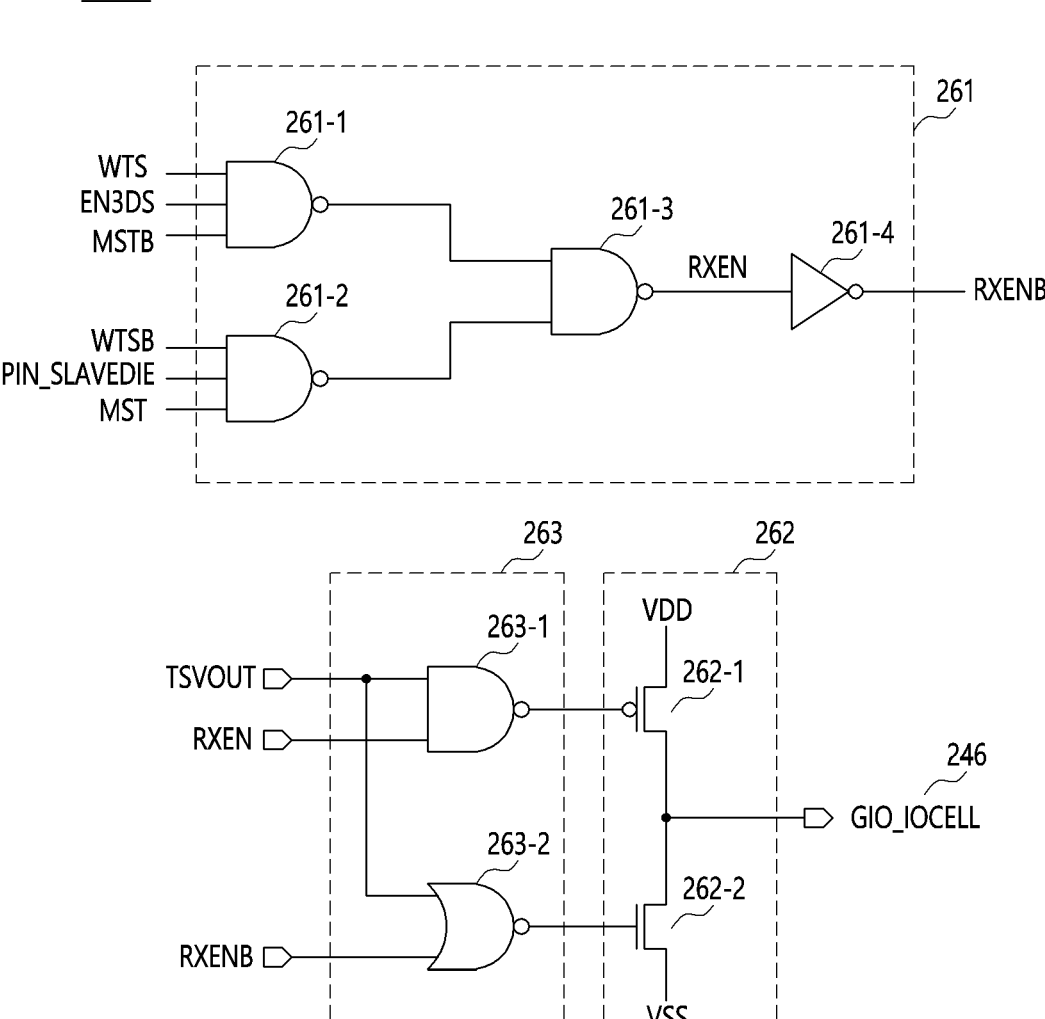
FIG. 15 is a diagram illustrating a construction of a receiver in FIG. 10.

FIG. 15 is a diagram illustrating a construction of the receiver 260 in FIG. 10.

Referring to FIG. 15, the receiver 260 may include a control signal generation unit 261, a driver 262, and a driver control unit 263.

The control signal generation unit 261 may generate a reception enable signal RXEN and an inverted reception enable signal RXENB, in response to the write signal WTS, the inverted write signal WTSB, the multi-chip operation signal EN3DS, the master chip distinction signal MST, the inverted master chip distinction signal MSTB, and the another chip pipe control signal PIN_SLAVEDIE. The control signal generation unit 261 may include first to fourth logic gates 261-1 to 261-4. The first logic gate 261-1 may output the results of a NAND operation on the write signal WTS, the multi-chip operation signal EN3DS, and the inverted master chip distinction signal MSTB. The second logic gate 261-2 may output the inverted write signal WTSB, the master chip distinction signal MST, and the another chip pipe control signal PIN_SLAVEDIE by performing a NAND operation on the inverted write signal WTSB, the master chip distinction signal MST, and the another chip pipe control signal PIN_SLAVEDIE. The third logic gate 261-3 may output, as the reception enable signal RXEN, the results of a NAND operation on the output of the first logic gate 261-1 and the output of the second logic gate 261-2. The fourth logic gate 261-4 may output the reception enable signal RXEN as the inverted reception enable signal RXENB by inverting the reception enable signal RXEN.

The driver 262 may drive the external processing signal line 246 to be suitable for the signal GIO_IOCELL. The driver 262 may include first and second transistors 262-1 and 262-2 that are coupled between the power supply terminal VDD and the ground terminal VSS. An output terminal of the driver 262, that is, drain terminals of the first and second transistors 262-1 and 262-2, may be coupled to the external processing signal line 246.

The driver control unit 263 may control the driver 262 in response to the signal TSVOUT that is transmitted through the through electrode 241, the reception enable signal RXEN, and the inverted reception enable signal RXENB. The driver control unit 263 may include first and second logic gates 263-1 and 263-2. The first logic gate 263-1 may control the first transistor 262-1 of the driver 262, based on the results of a NAND operation on the signal TSVOUT that is transmitted through the through electrode 241 and the reception enable signal RXEN. The second logic gate 263-2 may control the second transistor 262-2 of the driver 262, based on the results of a NOR operation on the signal TSVOUT that is transmitted through the through electrode 241 and the inverted reception enable signal RXENB.

Figure 16:
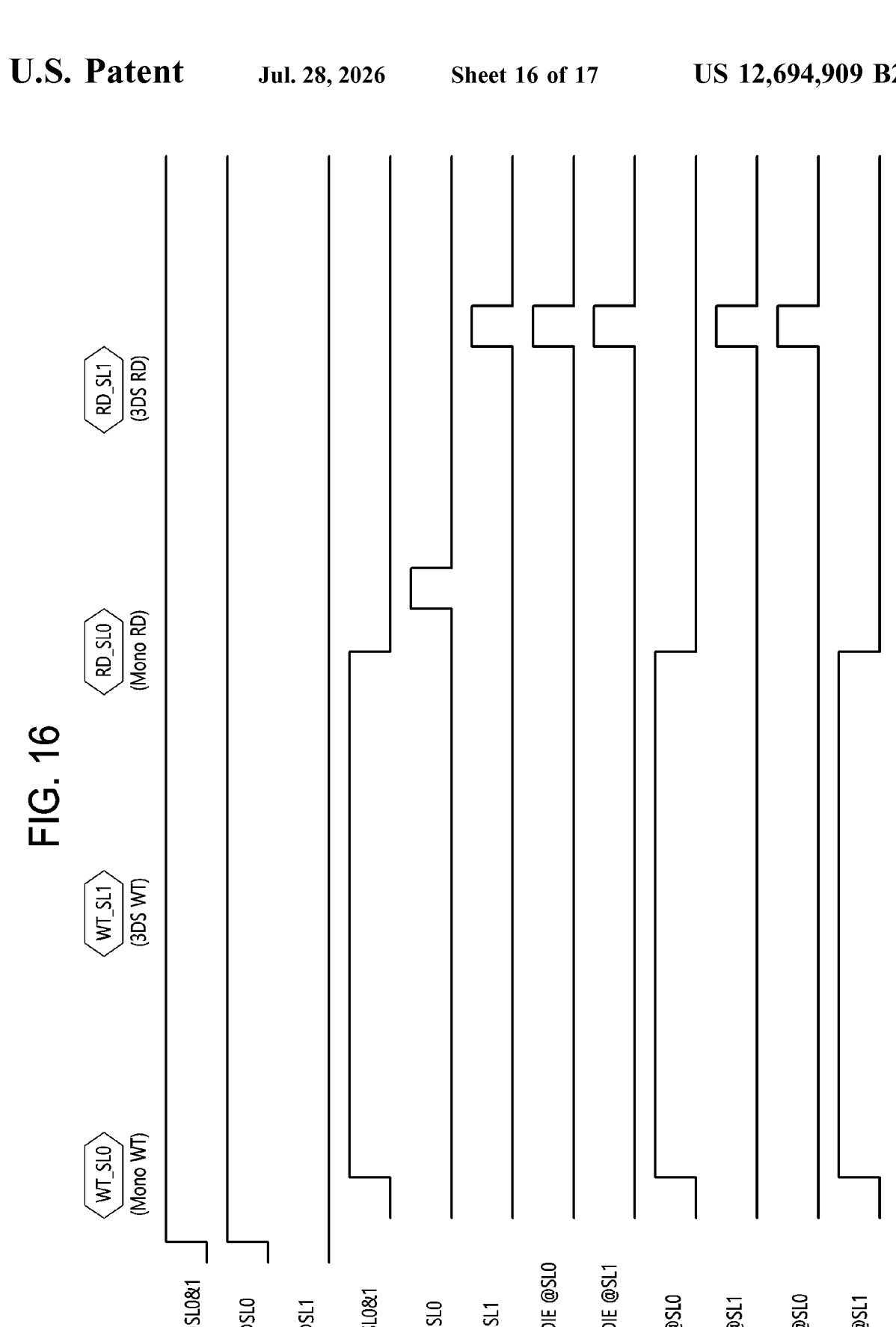
FIG. 16 is an operation timing diagram of the transmitter and the receiver in FIG. 10.
Figure 17:
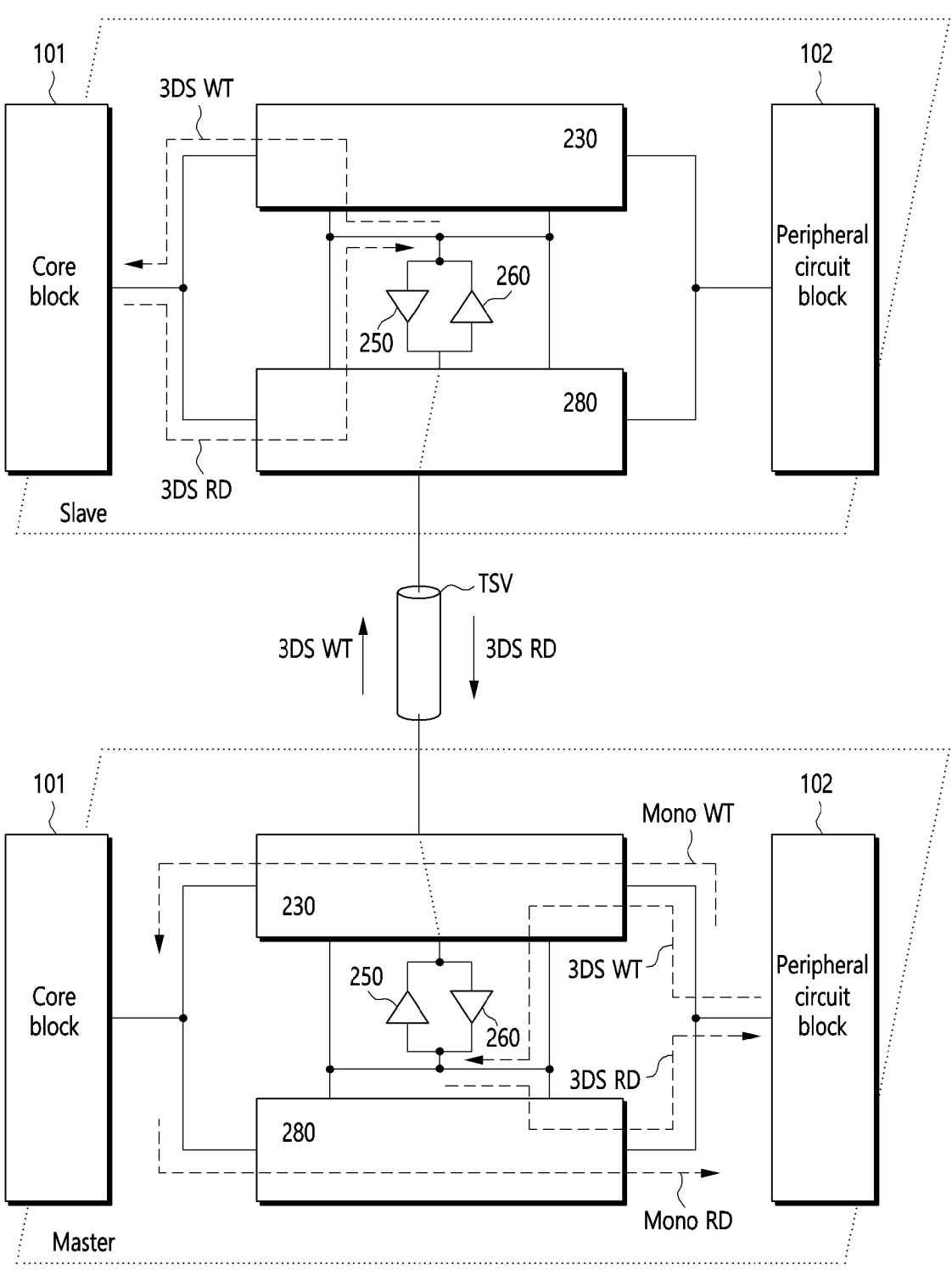
FIG. 17 is a diagram for describing write and read operations of the semiconductor memory device according to another embodiment.

FIG. 16 is an operation timing diagram of the transmitter 250 and the receiver 260 in FIG. 10. FIG. 17 is a diagram for describing write and read operations of the semiconductor memory device 200 according to another embodiment.

Hereinafter, write and read operations of the semiconductor memory device 200 are described with reference to FIGS. 16 and 17.

In FIGS. 16 and 17, an example in which the semiconductor memory device 200 operates as a multi-chip including the master chip SL1 and the slave chip SL1 has been taken.

In this case, a write operation for the slave chip SL1 may be called a three-dimensional write operation 3DS WT. A read operation for the slave chip SL1 may be called three-dimensional read operation 3DS RD. A write operation for the master chip SL1 may be called a mono write operation (Mono WT). A read operation for the master chip SL1 may be called a mono read operation (Mono RD). It is assumed that sequential write commands WT_SL1 and WT_SL1 and sequential read commands RD_SL1 and RD_SL1 for the master chip SL1 and the slave chip SL1 have been input.

A multi-chip operation signal EN3DS@SL1&1 having a high level may be input to the master chip SL1 and the slave chip SL1 because the master chip SL1 and the slave chip SL1 have a multi-chip structure.

The master chip distinction signal MST having a high level may be input to the master chip SL1. The master chip distinction signal MST having a low level may be input to the slave chip SL1. The write signal WTS having a high level may be input to the master chip SL1 and the slave chip SL1 in response to the write commands WT_SL1 and WT_SL1.

The master chip SL1 may generate the transmission enable signal TXEN having a high level during an interval in which the write signal WTS has a high level and during the interval in which the pipe control signal PIN has a high level because the master chip distinction signal MST having a high level is input to the master chip SL1.

The slave chip SL1 may generate the transmission enable signal TXEN having a high level during an interval in which the write signal WTS has a low level and the pipe control signal PIN has a high level because the master chip distinction signal MST having a low level is input to the slave chip SL1.

The transmitter 250 of the master chip SL1 and the slave chip SL1 may transmit the signal GIO_IOCELL of the external processing signal line 246 to the through electrode 241 during the interval in which the transmission enable signal TXEN has a high level.

After the start of the mono write operation (Mono WT) according to the write command WT_SL1 for the master chip SL1, data that is input from the outside of the semiconductor memory device 200 may be transmitted to the core block 101 via the peripheral circuit block 102 and the write multiplexer 230.

After the start of the three-dimensional write operation 3DS WT according to the write command WT_SL1 for the slave chip SL1, data that is input from the outside of the semiconductor memory device 200 may be transmitted to the slave chip SL1 via the peripheral circuit block 102, write multiplexer 230, transmitter 250, and through electrode 241 of the master chip SL1, and may be transmitted to the core block 101 via the receiver 260 and the write multiplexer 230 of the slave chip SL1.

The write signal WTS having a low level may be input to the master chip SL1 and the slave chip SL1 in response to the read commands RD_SL1 and RD_SL1.

The master chip SL1 may generate the reception enable signal RXEN having a high level during an interval in which the inverted write signal WTSB and the another chip pipe control signal PIN_SLAVEDIE have a high level because the master chip distinction signal MST having a high level is input to the master chip SL1.

The slave chip SL1 may generate the reception enable signal RXEN having a low level regardless of the level of the inverted write signal WTSB because the master chip distinction signal MST having a low level is input to the slave chip SL1.

The receiver 260 of the master chip SL1 may output the signal TSVOUT that is transmitted through the through electrode 241 to the external processing signal line 246 during an interval in which the reception enable signal RXEN has a high level. The receiver 260 of the slave chip SL1 may be deactivated because the reception enable signal RXEN has a low level.

After the start of the mono read operation (Mono RD) according to the read command RD_SL1 for the master chip SL1, data that is output by the core block 101 may be transmitted to the outside of the semiconductor memory device 200 via the read multiplexer 280 and the peripheral circuit block 102.

After the start of the three-dimensional read operation (3DS RD) according to the read command RD_SL1 for the slave chip SL1, data that is output by the core block 101 of the slave chip SL1 may be transmitted to the master chip SL1 via the read multiplexer 280, the transmitter 250, and the through electrode 241, and may be transmitted to the outside of the semiconductor memory device 200 via the receiver 260 of the master chip SL1, the read multiplexer 280, and the peripheral circuit block 102.

In the semiconductor memory device 200 according to another embodiment, the through electrode 241, the core block 101, and the peripheral circuit block 102 can share one receiver 260 and one transmitter 250 for the transmission of signals between the through electrode 241, the core block 101, and the peripheral circuit block 102. That is, the transmission of signals between the through electrode 241, the core block 101, and the peripheral circuit block 102 can be performed by using only one receiver 260 and one transmitter 250. Furthermore, the collision of data between different chips in a process of transmitting signals between the through electrode 241, the core block 101, and the peripheral circuit block 102 can be prevented by controlling the write multiplexer 230 and the read multiplexer 280. As described above, the layout margin of a semiconductor memory device can be increased by reducing a circuit area for the signaling of the through electrode.

As described above, those skilled in the art to which the present disclosure pertains may understand that the present disclosure may be implemented in various other forms without departing from the technical spirit or essential characteristics of the present disclosure. Accordingly, it is to be understood that the aforementioned embodiments are illustrative from all aspects not being limitative. The scope of the present disclosure is defined by the appended claims rather than by the detailed description, and all modifications or variations derived from the meanings and scope of the claims and equivalents thereof should be understood as being included in the scope of the present disclosure.

What is claimed is:

1. A semiconductor memory device comprising:
 a core block comprising a plurality of unit memory blocks;
 a peripheral circuit block comprising a data input/output pad;
 a through electrode configured to exchange signals with another semiconductor memory device; and
 a data input/output circuit coupled to the through electrode, the core block, and the peripheral circuit block and configured to share one receiver in order to transmit a signal from the through electrode to the peripheral circuit block and in order to transmit a signal from the through electrode to the core block.

2. The semiconductor memory device of claim 1, wherein the peripheral circuit block comprises:
 a deserializer configured to parallelize a signal that is output by the peripheral circuit block, and
 a serializer configured to serialize a signal that is output by the core block.

3. The semiconductor memory device of claim 1, wherein the data input/output circuit comprises a read multiplexer configured to transmit, to the peripheral circuit block, a signal that is output by the one receiver in response to a multi-chip operation signal after a start of a read operation, and
 an external processing signal line that is shared by the one receiver and the read multiplexer.

4. The semiconductor memory device of claim 1, wherein the data input/output circuit is configured to share one transmitter to transmit a signal from the core block to the through electrode and to transmit a signal from the peripheral circuit block to the through electrode.

5. The semiconductor memory device of claim 4, wherein the data input/output circuit is configured to transmit, to the one transmitter, a signal that is output by the peripheral circuit block in response to a multi-chip operation signal after a start of a write operation.

6. A semiconductor memory device comprising:
 a core block comprising a plurality of unit memory blocks;
 a peripheral circuit block comprising a data input/output pad;
 a through electrode configured to exchange signals with another semiconductor memory device;
 a receiver coupled to the through electrode;
 a read multiplexer configured to transmit, to the peripheral circuit block, an output signal that is output by the receiver in response to a multi-chip operation signal after a start of a read operation; and
 an external processing signal line that is shared by the receiver and the read multiplexer.

7. The semiconductor memory device of claim 6, wherein the receiver is configured to be activated in response to a write signal, the multi-chip operation signal, a master chip distinction signal, and another chip pipe control signal and to output, to the external processing signal line, a signal that is transmitted through the through electrode.

8. The semiconductor memory device of claim 6, wherein the read multiplexer is configured to selectively output a plurality of signals to the peripheral circuit block or the external processing signal line in response to the multi-chip operation signal, the write signal, and a pipe control signal.

9. The semiconductor memory device of claim 6, further comprising:

a transmitter coupled to the through electrode, and a write multiplexer configured to transmit, to the transmitter, a signal that is output by the peripheral circuit block in response to the multi-chip operation signal after a start of a write operation.

10. The semiconductor memory device of claim 9, wherein the external processing signal line is shared by the write multiplexer, the transmitter, the receiver, and the read multiplexer.

11. The semiconductor memory device of claim 9, wherein the transmitter is configured to be activated in response to a write signal, a master chip distinction signal, and a pipe control signal and to transmit, to the through electrode, a signal of the external processing signal line.

12. The semiconductor memory device of claim 9, wherein the write multiplexer is configured to selectively output a plurality of signals to the peripheral circuit block or the external processing signal line in response to the multi-chip operation signal, a write signal, and a master chip distinction signal.

13. A stack type semiconductor memory device comprising:

a plurality of semiconductor chips that are coupled through a plurality of through electrodes, wherein at least one of the plurality of semiconductor chips comprises a core block comprising a plurality of unit memory blocks, a peripheral circuit block comprising a data input/output pad, a through electrode configured to exchange signals with another semiconductor memory device, and a data input/output circuit, wherein the data input/output circuit comprises, an external processing signal line, a read multiplexer configured to selectively output a plurality of signals to the peripheral circuit block or the external processing signal line, a write multiplexer configured to selectively output a plurality of signals to the peripheral circuit block or the external processing signal line, a receiver configured to transmit a signal from the through electrode to the peripheral circuit block and to transmit a signal from the through electrode to the core block, and a transmitter configured to transmit a signal from the core block to the through electrode and to transmit a signal from the peripheral circuit block to the through electrode.

14. The stack type semiconductor memory device of claim 13, wherein the read multiplexer is configured to operate in response to a multi-chip operation signal and a pipe control signal after a start of a read operation.

15. The stack type semiconductor memory device of claim 14, wherein the write multiplexer is configured to operate in response to the multi-chip operation signal and a master chip distinction signal after a start of a write operation.

16. The stack type semiconductor memory device of claim 13, wherein the external processing signal line is shared by the write multiplexer, the transmitter, the receiver, and the read multiplexer.

17. The stack type semiconductor memory device of claim 13, wherein:

at least any one of the plurality of semiconductor chips is configured to operate as a master chip, and remaining semiconductor chips are configured to operate as slave chips, and after a start of a write operation for the slave chip, the write multiplexer of the slave chip is configured to block an input from the peripheral circuit block.

18. The stack type semiconductor memory device of claim 17, wherein after a start of a read operation for the slave chip, the read multiplexer of the master chip is configured to block an input from the core block.

* * * * *